(12) United States Patent
Jang

(10) Patent No.: US 8,665,656 B2
(45) Date of Patent: Mar. 4, 2014

(54) SEMICONDUCTOR MEMORY APPARATUS AND METHOD FOR CONTROLLING THE SAME

(75) Inventor: Chae Kyu Jang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 356 days.

(21) Appl. No.: 13/217,379

(22) Filed: Aug. 25, 2011

(65) Prior Publication Data
US 2012/0087197 A1    Apr. 12, 2012

(30) Foreign Application Priority Data
Oct. 6, 2010  (KR) .................. 10-2010-0097246

(51) Int. Cl.
*G11C 5/14*    (2006.01)

(52) U.S. Cl.
USPC .................. 365/189.09; 365/189.02; 365/226

(58) Field of Classification Search
USPC ................................ 365/189.09, 189.02, 226
See application file for complete search history.

(56) References Cited

U.S. PATENT DOCUMENTS

| | | | |
|---|---|---|---|
| 6,166,990 A * | 12/2000 | Ooishi et al. | 365/233.11 |
| 6,809,989 B2 * | 10/2004 | Takahashi et al. | 365/230.08 |
| 2008/0205111 A1 * | 8/2008 | Kajigaya et al. | 365/51 |
| 2012/0327725 A1 * | 12/2012 | Clark et al. | 365/189.011 |

* cited by examiner

*Primary Examiner* — Tuan T. Nguyen
(74) *Attorney, Agent, or Firm* — William Park & Associates Patent Ltd.

(57) ABSTRACT

A semiconductor memory apparatus includes: a skew monitoring unit configured to receive a reference voltage and monitor a voltage characteristic of a corresponding MOS transistor; a voltage sensing unit configured to provide a sensing voltage corresponding to the monitoring result of the voltage characteristic; a coding unit configured to multiplex an output signal of the voltage sensing unit and provide a skew control signal; and an internal voltage regulation unit configured to provide an internal voltage by regulating an internal bias voltage in response to the skew control signal.

16 Claims, 3 Drawing Sheets

SEMICONDUCTOR MEMORY APPARATUS AND METHOD FOR CONTROLLING THE SAME

CROSS-REFERENCES TO RELATED APPLICATION

The present application claims priority under 35 U.S.C. §119(a) to Korean application number 10-2010-0097246, filed on Oct. 6, 2010, in the Korean Intellectual Property Office, which is incorporated herein by reference in its entirety as set forth in full.

BACKGROUND

1. Technical Field

The present invention relates generally to a semiconductor integrated circuit, and more particularly, to a semiconductor memory apparatus which controls a voltage skew and a method for controlling the same.

2. Related Art

In general, a memory apparatus such as a NAND flash memory uses various levels of voltage.

A flash memory may receive a high voltage and a low voltage. The high voltage may include a word line program voltage, a pass bias voltage, a low-level high voltage and so on. Here, the pass bias voltage is a voltage which is applied to word lines adjacent to a selected word line, and the low-level high voltage is a voltage which is applied to word lines spaced a predetermined distance or more from the selected word line.

Nonvolatile memory design engineers set such various voltages to a target level and properly use the voltages in an internal circuit.

However, the target level of such voltages may be influenced according to a process variation, a process skew, a geometrical effect, and the physical position of a chip. Therefore, a constant target voltage is requested despite such environmental effects.

SUMMARY

In an embodiment of the present invention, a semiconductor memory apparatus includes: a skew monitoring unit configured to receive a reference voltage and monitor a voltage characteristic of a corresponding MOS transistor; a voltage sensing unit configured to provide a sensing voltage corresponding to the monitoring result of the voltage characteristic; a coding unit configured to multiplex an output signal of the voltage sensing unit and provide a skew control signal; and an internal voltage regulation unit configured to provide an internal voltage by regulating an internal bias voltage in response to the skew control signal.

In an embodiment of the present invention, a method for controlling a semiconductor memory apparatus includes the steps of: monitoring a voltage characteristic of a corresponding MOS transistor by using a reference voltage; sensing a voltage based on the monitoring result; and regulating an internal bias voltage in response to the voltage sensing result.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a method for controlling the same according to the present invention will be described below with reference to the accompanying drawings through exemplary embodiments.

Figure 1:
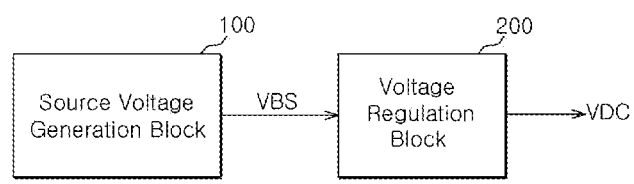
FIG. 1 is a block diagram of a semiconductor memory apparatus according to an embodiment.

FIG. 1 is a block diagram of a nonvolatile memory apparatus according to an embodiment. In an embodiment, a memory apparatus using a NAND flash memory may be taken as an example of the semiconductor memory apparatus.

Referring to FIG. 1, the semiconductor memory apparatus includes a source voltage generation block 100 and a voltage regulation block 200.

The source voltage generation block 100 is configured to provide a source voltage VBS by using a known reference voltage generator, or specifically, a bandgap reference voltage generator. The source voltage generation block 100 has the same configuration as that of a general bandgap reference voltage generator, and thus the detailed descriptions thereof will be omitted herein. The source voltage generation block 100 may satisfy the scope of the present invention, as long as the source voltage generation block 100 includes a reference voltage generator capable of detecting a temperate change and generating a reference voltage.

The voltage regulation block 200 according to an embodiment is configured to monitor a skew of the source voltage VBS and provide an internal voltage VDC at a stable level. When the source voltage VBS is applied, the voltage regulation block 200 may divide the range of physical voltages of MOS transistors depending on a process, compensate a voltage level according to the divided range, and provide the internal voltage VDC at the compensated voltage level. Therefore, according to an embodiment, although the voltage characteristics of the respective MOS transistors differ depending on a process skew, the process skew may be detected and compensated to provide the stable internal voltage VDC, which makes it possible to prevent a malfunction of the circuit.

Figure 2:
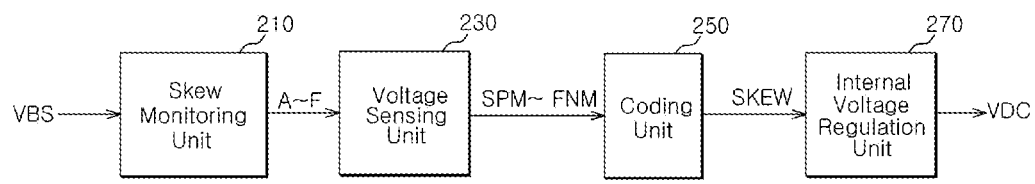
FIG. 2 is a simple block diagram of a voltage regulation block of FIG. 1.

FIG. 2 is a simple block diagram of the voltage regulation block 200 of FIG. 1.

Referring to FIG. 2, the voltage regulation block 200 includes a skew monitoring unit 210, a voltage sensing unit 230, a coding unit 250, and an internal voltage regulation unit 270.

The skew monitoring unit 210 is configured to receive a source voltage VBS and monitor a skew of the source voltage VBS. In other words, the skew monitoring unit 210 monitors how much the source voltage VBS deviates from the target range of a corresponding MOS transistor, that is, the range of the voltage skew. From a different point of view, the skew monitoring unit 210 may be described as follows. The skew monitoring unit 210 detects a physical voltage characteristic of the source voltage VBS serving as a reference voltage, that is, a distribution region within a voltage-current characteristic curve. For convenience of explanation, the voltage monitoring results of the respective MOS transistors (for example, PMOS and NMOS transistors) may be represented by A to E. Without being limited thereto, however, the detailed descriptions thereof will be described below in detail.

The voltage sensing unit 230 is configured to sense the detected analog voltage skew. The voltage sensing unit 230 may provide sensing voltages SPM-FNM at a digital level corresponding to the result of the skew monitoring unit 210.

The coding unit 250 is configured to multiplex an output signal of the voltage sensing unit 230 and provide a skew control signal SKEW. The coding unit 250 may include a general decoder configured to provide a coding signal according to an input signal. Therefore, since the configuration of the general decoder may be easily understood by those skilled in the art, the detailed descriptions thereof will be omitted herein.

The internal voltage regulation unit 270 is configured to provide the compensated internal voltage VDC to a corresponding internal circuit according to the skew control signal SKEW. The internal voltage control unit 270 according to an embodiment performs voltage compensation such that the respective MOS transistors are directed to the target level according to a combination result of sensing voltages SPM-FNM as input signals. Therefore, the internal voltage regulation unit 270 may regulate an internal bias voltage (not illustrated) to properly compensate for a voltage loss or overvoltage depending on a process skew of the source voltage VBS, and provide the internal voltage VDC at a stable level.

Figure 3:
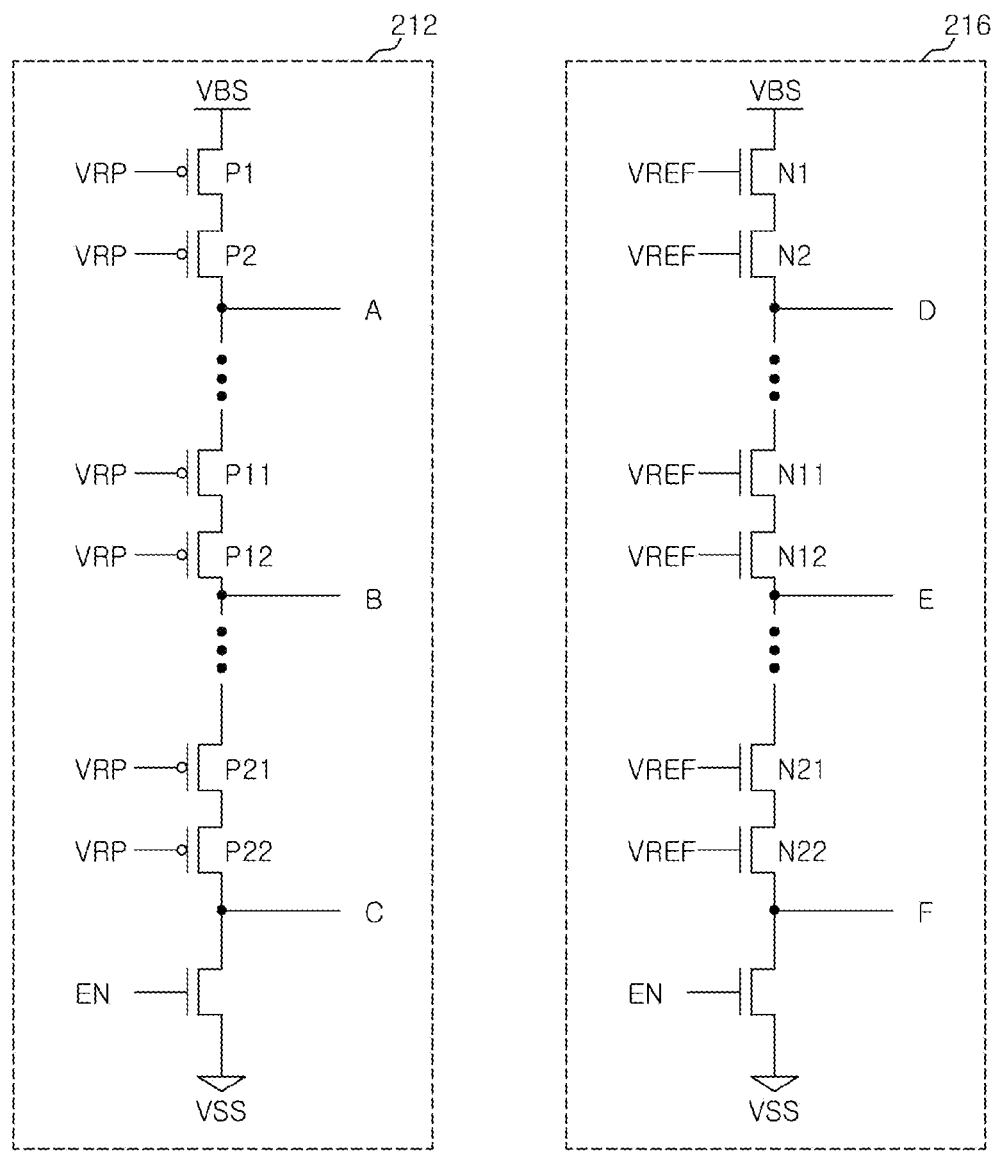
FIG. 3 is a circuit diagram of a skew monitoring unit of FIG. 2.

FIG. 3 is a circuit diagram of the skew monitoring unit 210 of FIG. 2.

Referring to FIG. 2, the skew monitoring unit 210 includes a first monitoring section 212 and a second monitoring section 216.

The first monitoring section 212 includes a plurality of PMOS transistors P1, P2, P11, P12, P21, P22 coupled in series. A node A of the first monitoring section 212 is where a voltage dropped by the first and second PMOS transistors P1 and P2 from the voltage of the source of the first PMOS transistor P1 is measured, a node B is where a voltage dropped by the third and fourth PMOS transistors P11 and P12 from the voltage of the source of the third PMOS transistor P11 is measured, and a node C is where a voltage dropped by the fifth and sixth PMOS transistors P21 and P22 from the voltage of the source of the fifth PMOS transistor P21 is measured.

Here, gate voltages VRP of the respective PMOS transistors P1, P2, . . . , P22 may include bias voltages capable of weakly turning on the PMOS transistors P1, P2, . . . , P22. Therefore, the gate voltage VRP may be replaced with any voltage capable of weakly turning on the transistors. Furthermore, the respective transistors P1, P2, . . . , P22 may be formed in different sizes. For example, the first and second PMOS transistors P1 and P2 may have a larger size than the third and fourth PMOS transistors P3 and P4, and the fifth and sixth PMOS transistors P21 and P22 may have a larger size than the third and four PMOS transistors P21 and P22. Thus, the monitoring references of the respective nodes A, B, and C may be set.

The second monitoring unit 216 also includes a plurality of NMOS transistors N1, N2, N11, N12, N21, and N22 coupled in series.

A node D of the second monitoring unit 216 is where a voltage dropped by the first and second NMOS transistors N1 and N2 from the voltage of the drain of the first NMOS transistor N1 is measured, a node E of the second monitor unit 216 is where a voltage dropped by the third and fourth N11 and N12 from the voltage of the drain of the third NMOS transistor N11 is measured, and a node F of the second monitor unit 216 is where a voltage dropped by the fifth and sixth NMOS transistors N21 and N22 from the voltage of the drain of the fifth NMOS transistor N21 is measured. Gate voltages VREF of the respective NMOS transistors N11, N12, . . . , N22 of the second monitoring section 216 may include bias voltages capable of weakly turning on the NMOS transistors N1, N2, . . . , N22.

More specifically, when the source voltage VBS is applied and the first monitoring section 212 is turned on by an enable signal EN, the first monitoring section 212 may be operated.

Here, it may be assumed that when the nodes A and B are set to a high level and the node C is set to a low level by the applied source voltage VBS, the physical voltages of the PMOS transistors correspond to a target level.

When the node A of the first monitoring section 212 is at a high level and the nodes B and C are at a low level, it means that the range of physical voltages of the PMOS transistors has PMOS voltages at a weak level with respect to the target level, that is, in a slow region of the voltage-current characteristic curve. Furthermore, when the nodes A to C are at a high level, it means that when a constant current flows, the range of physical voltages of the PMOS transistors has PMOS physical voltages with an overvoltage level with respect to the target level, that is, in a fast region of the voltage-current characteristic curve. Therefore, when the current flows, the respective nodes of the first monitoring section 212 are measured to a high or low level according to a difference in electron mobility between the respective transistors such that the first monitoring section 212 monitors the voltage characteristics of the MOS transistors.

According to a similar principle, the second monitoring section 216 is operated.

Therefore, the skew monitoring unit 210 according to the embodiment may monitor the physical characteristic results of the respective PMOS and NMOS transistors through such a simple circuit configuration, and provide the physical characteristic results as voltage levels of the respective nodes.

Figure 4:
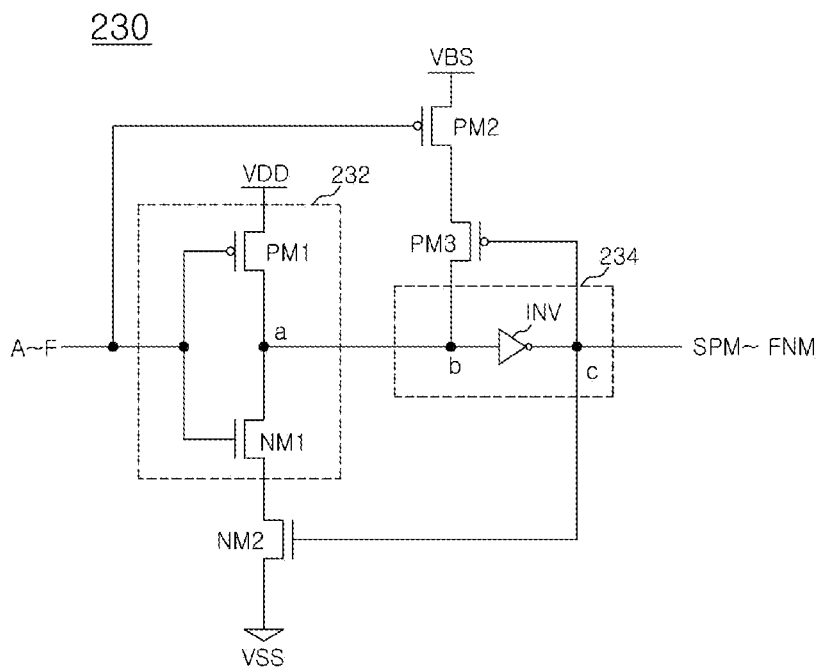
FIG. 4 is a circuit diagram of a voltage sensing unit of FIG. 2.

FIG. 4 is a circuit diagram of the voltage sensing unit 230 of FIG. 2.

Referring to FIG. 4, the voltage sensing unit 230 is configured to convert the detected node voltages A-F into bias voltages SPM-FNM at a digital level.

For convenience of description, the respective node voltages A-F and the plurality of bias voltages SPM-FNM are represented in one circuit, but the configuration is not limited thereto. For example, the voltage sensing unit 230 may include a circuit which outputs the bias voltage SPM (slow PMOS) corresponding to the node voltage A, a circuit which outputs the bias voltage TPM (typical PMOS) corresponding to the node voltage B, and so on.

The voltage sensing unit 230 includes an input section 232 and an inversion section 234.

The input section 232 includes a first PMOS transistor PM1 and a first NMOS transistor NM1, which are coupled in series.

The inversion section 234 is configured to invert a signal of a node b. The inversion section 234 includes an inverter INV.

Accordingly, the voltage sensing unit 230 may receive analog voltages (the respective node voltages, refer to reference numeral 210 of FIG. 2) and convert the received analog voltages into digital levels. For example, when the voltage of the node A is at a high level, the first NMOS transistor NM1 is weakly turned on, and the node a becomes a low level. The inversion section 234 converts the low level into a digital high level and outputs the digital high level. Since the coding unit 250 is a digital circuit, the conversion of the voltage level may be performed for the coding unit 250.

When the node A of the skew monitoring unit 210 is at a high and the nodes B and C are at a low level, the voltage sensing unit 230 outputs the bias voltage SPM as a high level in the digital voltage range and outputs the bias voltages TPM and FPM as a low level in the digital voltage range.

The coding unit 250 may combine the digital levels of the respective node voltages A-F of the skew monitoring unit 210, and code the combination of the respective node voltages.

As described above, when the voltage sensing unit 230 outputs the bias voltage SPM having a high level and the bias voltages TPM and FPM having a low level, it means that the voltage range has PMOS voltages at a weak level with respect to the target level, that is, in the slow region of the voltage-current characteristic curve. Furthermore, when the nodes A to C of the skew monitoring unit 210 are at a high level, it means that when a constant current flows, the voltage range has PMOS physical voltages at an overvoltage level with respect to the target level, that is, in the fast region of the voltage-current characteristic curve.

In response to such a result, the internal voltage regulation unit 270 may compensate an internal bias voltage (not illustrated) by reflecting the combination result to compensate the voltages, and thus provide the internal voltage VDC having a stable level even when a process variation occurs. That is, when it is detected that the corresponding MOS transistor has a voltage in the slow region of the current-voltage characteristic curve, the internal voltage regulation unit 270 regulates an internal bias voltage such that the internal bias voltage has a higher level. On the other hand, when it is detected that the corresponding MOS transistor has a voltage in the fast region of the current-voltage characteristic curve, the internal voltage regulation unit 270 regulates an internal bias voltage such that the internal bias voltage has a lower level. Accordingly, the internal voltage regulation unit 270 regulates the internal bias voltage so as to properly compensate for a voltage loss or overvoltage depending on the process skew of the source voltage VBS, and provides the internal voltage VDC at a stable level.

Figure 5:
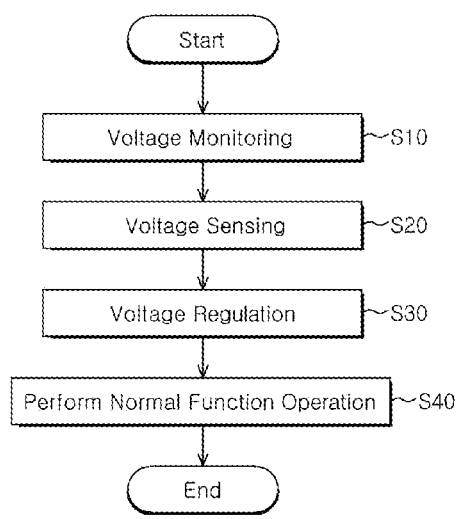
FIG. 5 is a flow chart showing a method for controlling the semiconductor memory apparatus according to an embodiment.

FIG. 5 is a flow chart showing a method for controlling the semiconductor memory apparatus according to an embodiment.

Referring to FIG. 5, before the semiconductor memory apparatus is operated, the physical characteristics of the MOS transistors depending on a process variation are monitored.

Then, voltages of the PMOS transistors and the NMOS transistors are monitored at step S10.

The monitored voltages are sensed and converted into proper levels at step S20. That is, analog node voltages based on the monitoring results are received and converted into digital levels.

The monitoring results at digital levels are combined and decoded, and internal bias voltages are regulated according to the decoding results at step S30.

According to the result obtained by regulating the internal bias voltages, a compensated internal voltage is provided to perform normal function operations at step S40.

In an embodiment, as the voltage sensing block 100 (refer to reference numeral 100 of FIG. 1) which detects a temperature change is applied, the semiconductor memory apparatus may flexibly operate not only at hot temperature but also at cold temperature.

That is, according to an embodiment, the voltage characteristics of the MOS transistors depending on a process may be monitored and compensated. Furthermore, the semiconductor memory apparatus may be applied even when a voltage skew occurs depending on a temperature change.

According to an embodiment of the present invention, the voltage skew of the MOS transistors may be monitored and detected by using the reference source voltage, in order to regulate the internal bias voltages. Therefore, since a constant internal voltage may be provided, it is possible to not only prevent a malfunction of the semiconductor memory apparatus, but also reduce current consumption.

While certain embodiments have been described above, it will be understood to those skilled in the art that the embodiments described are by way of example only. Accordingly, the semiconductor memory apparatus and the method described herein should not be limited based on the described embodiments. Rather, the semiconductor memory apparatus and the method described herein should only be limited in light of the claims that follow when taken in conjunction with the above description and accompanying drawings.

What is claimed is:

1. A semiconductor memory apparatus comprising:
   a skew monitoring unit configured to receive a reference voltage and monitor a voltage characteristic of a corresponding MOS transistor;
   a voltage sensing unit configured to provide a sensing voltage corresponding to a monitoring result of the voltage characteristic, as an output signal;
   a coding unit configured to multiplex the output signal of the voltage sensing unit and provide a skew control signal; and
   an internal voltage regulation unit configured to provide an internal voltage by regulating an internal bias voltage in response to the skew control signal.

2. The semiconductor memory apparatus according to claim 1, wherein the skew monitoring unit monitors a voltage based on a difference in electron mobility of a plurality of MOS transistors according to the applied reference voltage, when a constant current flows in the skew monitoring unit.

3. The semiconductor memory apparatus according to claim 2, wherein the skew monitoring unit comprises a PMOS transistor monitoring section and an NMOS transistor monitoring section.

4. The semiconductor memory apparatus according to claim 1, wherein the voltage sensing unit converts a received input level into a digital level.

5. A method for controlling a semiconductor memory apparatus, comprising the steps of:
   monitoring a voltage characteristic of a corresponding MOS transistor by using a reference voltage;
   sensing a voltage based on the monitoring result; and
   regulating an internal bias voltage in response to the voltage sensing result.

6. The method according to claim 5, wherein, in the step of monitoring the voltage characteristic, when a constant current flows, a voltage based on a difference in electron mobility of the corresponding MOS transistor according to the applied reference voltage is monitored.

7. The method according to claim 5, wherein, in the step of sensing the voltage, the voltage based on the monitoring result is converted into a digital level.

8. The method according to claim 5, wherein, in the step of regulating the internal bias voltage, a result signal of the voltage sensing is coded.

9. A semiconductor integrated circuit comprising:
   a source voltage generation block configured to generate a source voltage; and
   a voltage regulation block configured to receive the source voltage, monitor a skew of the source voltage, and stabilize the source voltage, wherein the voltage regulation block comprises:
a skew monitoring unit configured to detect the skew of the source voltage;
a voltage sensing unit configured to provide a sensing voltage corresponding to a monitoring result of the skew monitoring unit;
a coding unit configured to output and provide an output signal of the voltage sensing unit as a skew control signal; and
an internal voltage regulation unit configured to provide an internal voltage by regulating an internal bias voltage in response to the skew control signal.

10. The semiconductor integrated circuit according to claim 9, wherein the skew monitoring unit is configured to monitor a voltage characteristic for each type of MOS transistors.

11. The semiconductor integrated circuit according to claim 10, wherein the skew monitoring unit monitors a voltage based on a difference in electron mobility between the respective MOS transistors according to the source voltage, when a constant current is applied.

12. The semiconductor integrated circuit according to claim 11, wherein the skew monitoring unit comprises a PMOS transistor monitoring section and an NMOS transistor monitoring section.

13. The semiconductor integrated circuit according to claim 12, wherein the PMOS transistor monitoring section comprises a plurality of PMOS transistors coupled in series, and the plurality of PMOS transistors are driven by bias voltages which turn on the PMOS transistors weakly.

14. The semiconductor integrated circuit according to claim 12, wherein the NMOS transistor monitoring section comprises a plurality of NMOS transistors coupled in series, and the plurality of NMOS transistors are driven by bias voltages which turn on the NMOS transistors weakly.

15. The semiconductor integrated circuit according to claim 9, wherein the voltage sensing unit is configured to sense the analog voltage skew from the skew monitoring unit as the monitoring result.

16. The semiconductor integrated circuit according to claim 15, wherein the voltage sensing unit converts the analog voltage skew into a digital level.

* * * * *